United States Patent
Tanaka

(10) Patent No.: US 8,062,970 B2
(45) Date of Patent: Nov. 22, 2011

(54) PRODUCTION METHOD FOR SEMICONDUCTOR DEVICE

(75) Inventor: Tomoya Tanaka, Toyama (JP)

(73) Assignee: Panasonic Corporation, Osaka (JP)

( * ) Notice: Subject to any disclaimer, the term of this patent is extended or adjusted under 35 U.S.C. 154(b) by 582 days.

(21) Appl. No.: 12/208,740

(22) Filed: Sep. 11, 2008

(65) Prior Publication Data

US 2009/0081812 A1   Mar. 26, 2009

(30) Foreign Application Priority Data

Sep. 21, 2007   (JP) ................................ 2007-246115

(51) Int. Cl.
*H01L 21/4763* (2006.01)
(52) U.S. Cl. .. 438/629; 438/639; 438/672; 257/E29.119
(58) Field of Classification Search .......... 438/622–658, 438/668–679; 257/E29.119
See application file for complete search history.

(56) References Cited

U.S. PATENT DOCUMENTS

2005/0123710 A1*   6/2005   Matsumoto et al. ......... 428/64.4

FOREIGN PATENT DOCUMENTS

JP   2000-64037   2/2000

OTHER PUBLICATIONS

O'Sullivan et al., Simulation of physical vapor deposition into trenches and vias: Valiation and comparison with experiment, Journal of Applied Physics, vol. 88, No. 7, pp. 4061-4068, Oct. 2000.*

* cited by examiner

*Primary Examiner* — H. Jey Tsai
(74) *Attorney, Agent, or Firm* — McDermott Will & Emery LLP

(57) ABSTRACT

The present invention is a production method for a semiconductor device equipped with a conductive film with predetermined film thickness on a sidewall of a concave portion formed in an insulating film, and comprises a step of forming the concave portion in the insulation film formed on a semiconductor substrate. Herein, the concave portion is a generic name of a via-hole and a trench. This production method comprises a step of forming a conductive film with film thickness, which is film thickness of a conductive film to be formed in the concave portion, and which is film thickness, calculated based upon the depth of the concave portion and a projected area of the sidewall of said concave portion when viewing the concave portion from the upper surface, and to be formed over the upper surface of the insulating film where the concave portion is formed. In other words, a film is formed taking the variation of configuration of these based upon a projected area of a via-hole or a trench into consideration.

4 Claims, 9 Drawing Sheets

PRODUCTION METHOD FOR SEMICONDUCTOR DEVICE

BACKGROUND OF THE INVENTION

The present invention relates to a production method for a semiconductor device, and it relates to a sputtered film formation method to a via-hole or a trench in a wiring formation process.

DESCRIPTION OF THE RELATED ART

Recently, in association with miniaturization and multilayering of wiring in a semiconductor device, a damascene technology where the wiring form of a groove (hereafter, referred to as a 'trench') or a hole for making electric contact with a lower-level wire (hereafter, referred to as 'via-hole') is formed in an insulating film; a conductive film is buried into a groove or within the hole; and excess conductive film is removed using chemical mechanical polishing (CMP), and wiring is formed is practically used. As the conductive film to be buried into these trenches or via-holes, for example, copper is used.

A damascene interconnect formation in the case of using copper is described hereafter with reference to FIG. 9 to FIG. 13.

The case of FIG. 9 to FIG. 13, for example, a step of forming wiring where a conductive film is buried into the via-hole formed into the insulating film is shown. FIG. 9A shows an enlarged plan view of a via-hole periphery, and FIG. 9B shows a cross sectional view on the X-X line in FIG. 9A. Furthermore, FIG. 10 to FIG. 13 show only a cross sectional view, respectively.

Further, a semiconductor element has already been formed in a predetermined position on the semiconductor substrate, and the step of covering the element with an insulating film is described.

As shown in FIG. 9B, a first interlayer insulating film 51 comprising an interlayer insulating film of a lower-level wire, is deposited, and a trench pattern of the lower-level wire is formed in this first interlayer insulating film layer 51 using photolithography and etching. Next, a barrier film 52, such as TaN, and a base wiring material 53 made of Cu or Cu alloy are deposited in respective order, and are polished by CMP, and when the surface of the first interlayer insulating film 51 is exposed, the lower-level wire where the barrier film 52 and the base wiring material 53 are buried in the trench pattern is formed. Next, a nitride film 54 covering the lower-level wire and a second interlayer insulating film 55 are deposited. Then, a via-hole 56 is formed in a predetermined position of the second interlayer insulating film 55 using lithography and etching. Furthermore, in FIG. 9 (a), although the hole shape is circular, it can be a trench shape similar to the wiring.

As shown in FIG. 10, a barrier film 57 is formed not only on the substrate surface but within the via-hole 56 using the sputtering method. The barrier film 57 is formed in order to prevent the copper component in the wiring layer (Cu film) to be formed later from diffusing into the second interlayer insulating film 55. Furthermore, as the material of the barrier film 57, for example, a Ta film, a TaN film, a Ti film, a TiSi film, a TiN film and a WN film can be adopted.

Next, as shown in FIG. 11, a seed film 58 is formed using the sputtering method. This seed film 58 is formed so as to supply sufficient electric current to reduce metal ions in the liquid and to precipitate them as metal solids, as an electric cathode during a plating process to be conducted below. Further, for this seed film 58, taking adhesion and contact resistance with a plating film to be described later into consideration, a Cu film or Cu alloy film, which is the same as the wiring layer, can be used.

Next, as shown in FIG. 12, electrolytic plating is conducted using the seed film 58 as an electrode, and a plating film (Cu film) 59 is formed over the entire surface of the substrate including the inside of the via-hole 56.

Next, as shown in FIG. 13, for example, the plating film 59 on the second interlayer insulating film 55 outside the via-hole 56, the seed film 58 and the barrier film 57 are removed by the chemical mechanical polishing (CMP), and the surface of the Cu film 59 filling the via-hole 56 and the surface of the second interlayer insulating film 55 are formed to be coplanar. Repeating the above-mentioned steps results in the formation of a buried-type wiring layer made from Cu film 59.

In the sputtering method used as a method to form the barrier film 57 and the seed film 58, in general, if the target depletion is advanced, the film formation rate is changed. Then, as a prior art, a control method where a film formation rate according to the target depletion state is estimated in order to obtain desired film thickness, and the film is treated for the treatment time calculated from this film formation rate and a device thereof are disclosed in Japanese Patent Application Laid-Open No. 2000-64037.

SUMMARY OF THE INVENTION

During the Cu wiring step in a rule for minute devices with 65 nm or less, in order to maintain the burying performance and to obtain stable wiring reliability, it is necessary to form the barrier film and the seed film with desired film thickness on the sidewall of the via-hole or the trench using the sputtering method.

If the sidewall film thickness of the barrier film 57 is thinner than the predetermined film thickness, a problem occurs where the copper component in the wiring layer (Cu film) 57 is diffused to the second interlayer insulating film 55 from the thinner portion of the barrier film due to the reduction of barrier property. Further, if the film thickness is thicker than the predetermined one, circuit behavior fails due to an increase in resistance, and clearance of the opening of the via-hole 56 becomes narrower, and the burying is not properly conducted at the time of plating treatment thereafter, and voids occur and wiring may be disconnected or wiring reliability may be deteriorated.

Further, if the film thickness of the sidewall in the seed film 58 is thinner than predetermined film thickness, a thinner portion in the film thickness disappears due to a plating liquid at the time of plating treatment thereafter, and because a sufficient electric current does not flow at the disappeared portion, copper will not be precipitated and it causes burying failure, disconnection of wiring due to minute void occurrence or deterioration of wiring reliability. Further, if it is thicker than the predetermined film thickness, the clearance of the opening at the via-hole 56 becomes narrower, and burying at the time of plating will not be properly conducted, and it causes the occurrence of voids, disconnection of wiring, or deterioration of wiring reliability.

It is necessary to control the film thickness of the barrier film 57 and the seed film 58 with the estimation of the film formation rate according to the depletion state of the sputter target, and in the technology shown in Patent Literature 1, assuming a sputtering device with a control using only the target DC power, the film thickness is controlled using a prediction method by taking only the target depletion into consideration.

In a device with rules for devices of 65 nm or less, in order to obtain bottom coverage and sidewall coverage of minute via-hole, a sputtering device where substrate RF power, side coil RF power and side coil DC power are applied and orientation is enhanced has become mainstream. Consequently, the film formation rate cannot be sufficiently predicted from a prediction expression in the Patent Literature 1, and predetermined film thickness cannot be obtained.

In a minute device of 65 nm or less, ArF exposure technology is used for the pattern formation of a via-hole or a trench. However, because the dry-etching tolerance of the resist material for ArF exposure is low, striation of sidewall of a hole or a trench may occur after dry-etching. Consequently, it is difficult to control the variation in the shape of a via-hole or a trench. As described above, if the shape varies and changes, even though a film to be deposited on the upper flat portion of the substrate is controlled to be a consistent film thickness, the film thickness of sidewall in the films to be deposited onto the via-hole or the trench varies depending upon its configuration (taper angle, depth and/or striation), making it necessary to control the film thickness of a sidewall with high accuracy according to the device configuration (via-hole configuration or trench configuration).

The present invention has been accomplished by taking these problems into consideration, and the objective is to provide a production method for a semiconductor device where even if a device is miniaturized and a configuration of the via-hole or trench varies, a barrier film and a seed film are formed with predetermined film thickness on the sidewall of the via-hole and the trench.

In order to accomplish the objective, the present invention has adopted the means mentioned below.

The present invention is a production method for a semiconductor device comprising a conductive film with predetermined film thickness on a sidewall of the concave portion formed in an insulating film, and the production method comprises a step of forming the concave portion in the insulating film formed on the semiconductor substrate. In this case, the concave portion is a collective term of a via-hole and a trench.

Next, the production method comprises a step of forming a conductive film with film thickness, which is film thickness of a conductive film to be formed in the concave portion, and which is film thickness, calculated based upon the depth of the concave portion and a projected area of the sidewall of said concave portion when viewing the concave portion from the upper surface, and to be formed over the upper surface of the insulating film where the concave portion is formed. In other words, a conductive film is formed by taking the variation of these configurations the via-hole or the trench based upon their projected areas into consideration.

Herein, the step of forming the conductive film comprises a step of measuring the depth of the concave portion, a step of measuring an opening area of the upper end of the concave portion and an opening area of the bottom of the concave portion, and a step of calculating a projected area of the sidewall of the concave portion according to a difference between the opening area of the upper end of the concave portion and the opening area of the bottom of the concave portion. Further, the step of forming the conductive film comprises a step of calculating the film thickness to be formed over the upper surface of the insulating film where the concave portion is formed, according to a film thickness estimation expression expressed with the measured depth of the concave portion, the calculated projected area, the film thickness of the conductive film to be formed on the sidewall of the concave portion. In addition, the step of forming the conductive film comprises the step of forming a conductive film to be an insulating film-state where the concave portion is formed using the sputtering method, with the calculated film thickness to be formed over the upper surface of the insulating film.

In other words, the present invention is characterized by appropriately predicting the film thickness on the occasion of sputtered film formation based upon a projected area and depth, and even if the configuration of the via-hole or trench varies, a film can be formed onto these sides with predetermined film thickness.

In addition, in the present invention, a treatment time for obtaining the calculated film thickness to be formed over the upper surface of the insulating film where the concave portion is formed is calculated from the film formation rate prediction expression expressed with the calculated film thickness to be formed over the upper surface of the insulating film where the concave portion is formed and a device parameter of the device where the sputtered film formation is implemented. Then, the conductive film is formed by forming a conductive film for the calculated treatment time. In other words, after a treatment time required for the sputtered film formation is estimated, this sputtered film is formed.

As described above, according to the present invention, even if the configuration of a via-hole or a trench varies, because a barrier film and a seed film can be formed with desired film thickness onto a sidewall thereof using an estimation expression based upon a projected area and depth.

DETAILED DESCRIPTION OF PREFERRED EMBODIMENTS

Figure 1A:
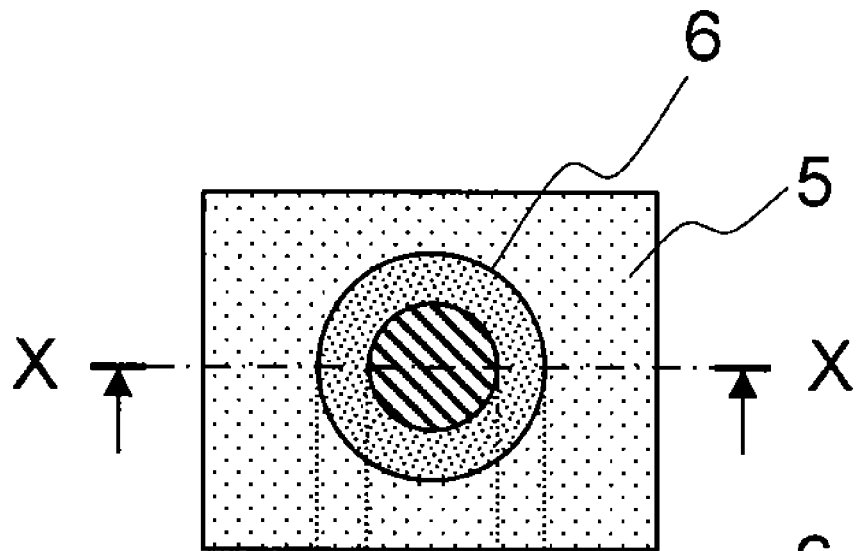
FIGS. 1A and 1B are process drawings of a production method for a semiconductor device of the present invention.

An example of an embodiment of the present invention is described hereafter with reference to FIG. 1A to FIG. 8B. Hereafter, the via-hole or trench may be collectively named as 'concave portion'. The case of FIG. 1A to FIG. 5 shows, for example, a case of forming a burying type of wiring within the concave portion formed in an insulating film. Further, FIG. 1A shows an enlarged plan view of the periphery of the concave portion, and FIG. 1B shows a cross sectional view on the X-X' line in FIG. 1A. Furthermore, FIG. 2 to FIG. 5 show only cross sectional views.

Figure 6:
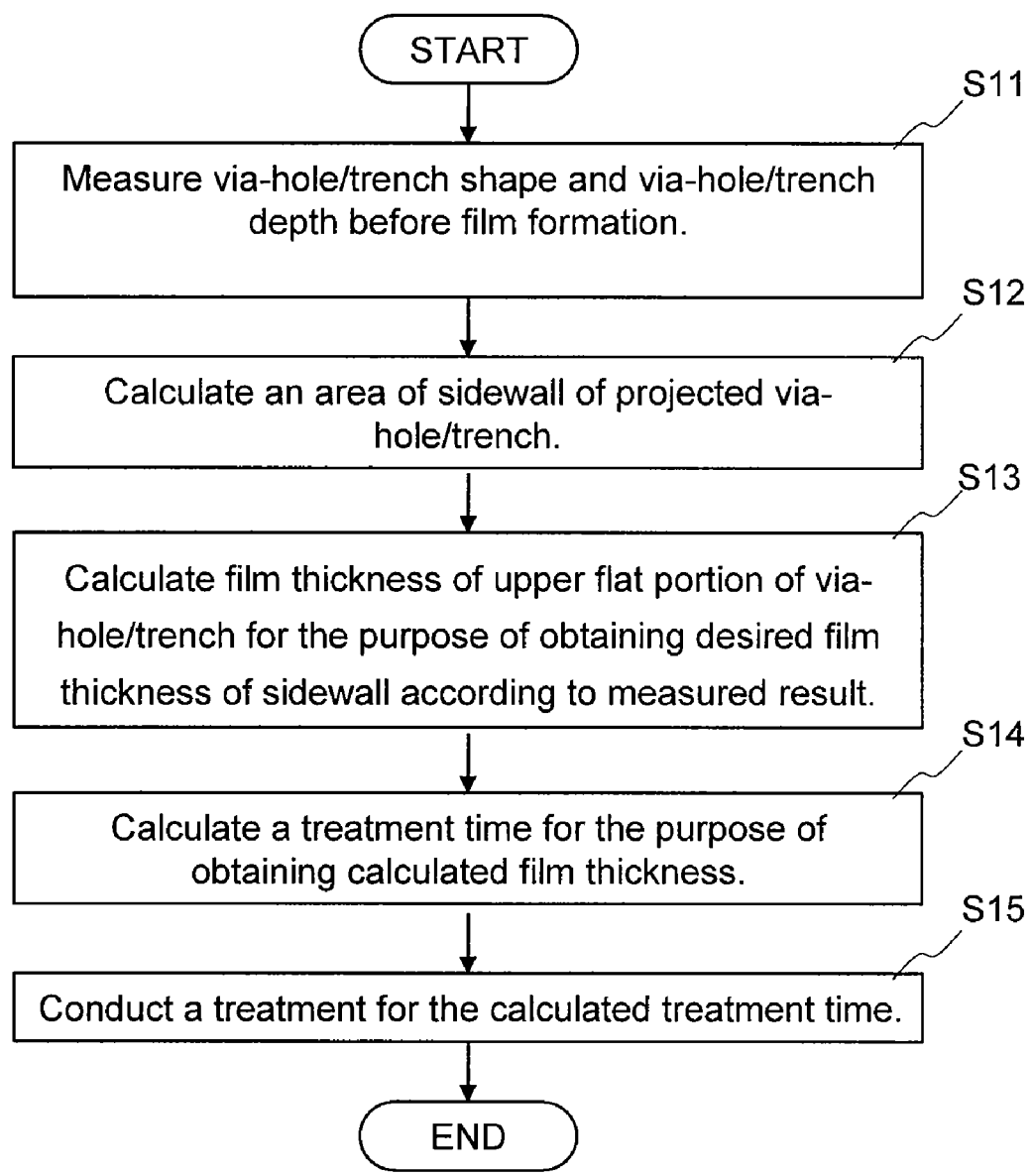
FIG. 6 is a process drawing of a production method for a semiconductor device of the present invention.
Figure 7A:
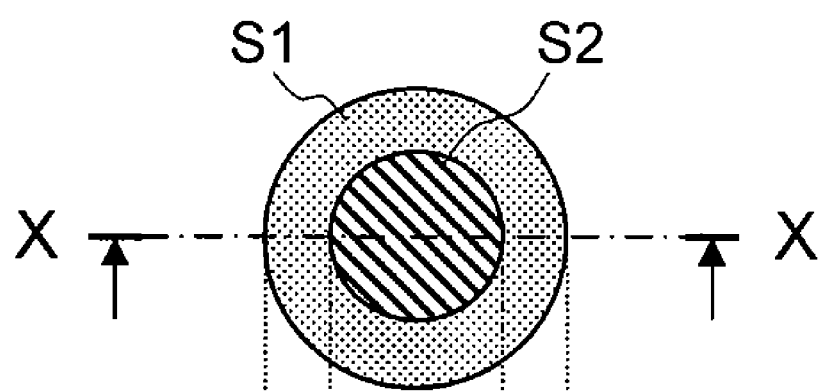
FIGS. 7A and 7B are explanatory diagrams of a relationship between film thickness of an upper flat part and average film thickness of sidewall in a via-hole.
Figure 7B:
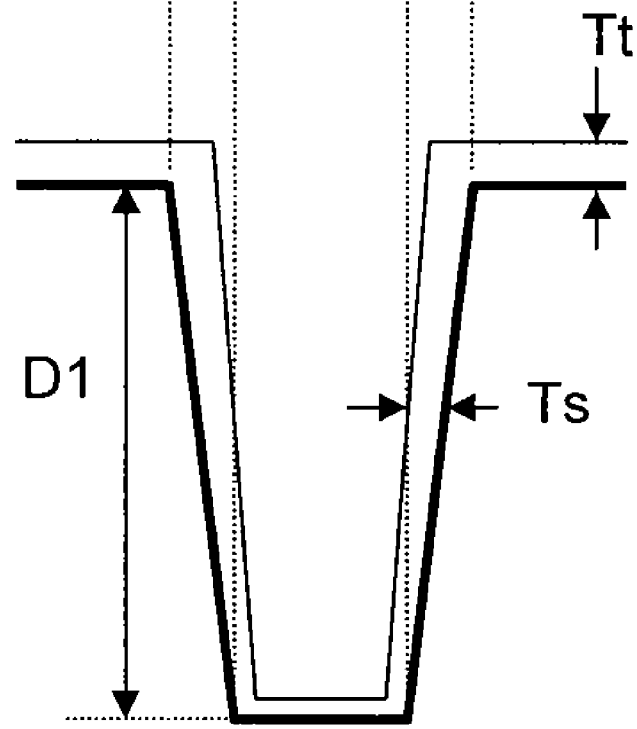
Figure 8A:
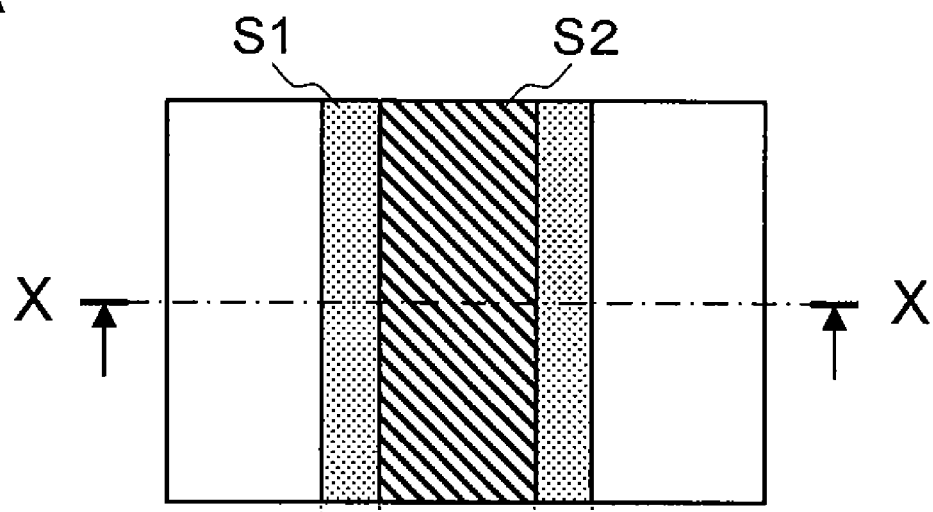
FIGS. 8A and 8B are explanatory diagrams of a relationship between film thickness of an upper flat part and average film thickness of sidewall in a trench.
Figure 8B:
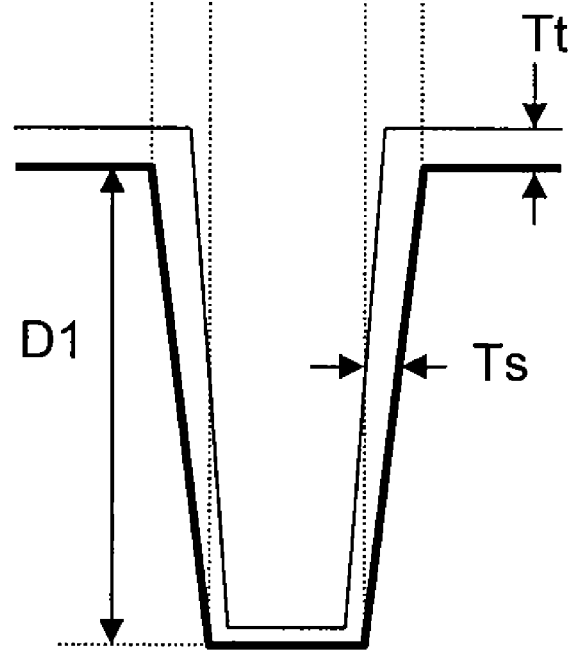
Figure 9A:
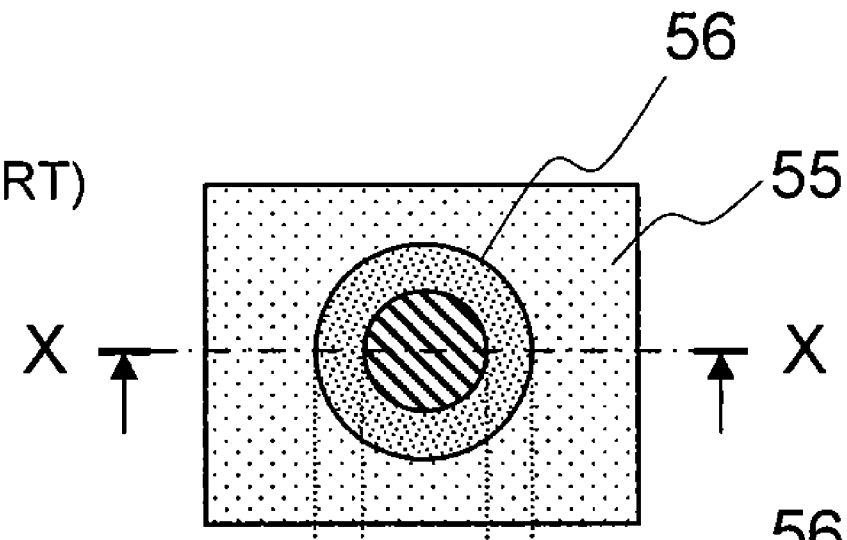
FIGS. 9A and 9B are explanatory diagrams of conventional via-hole formation.
Figure 9B:
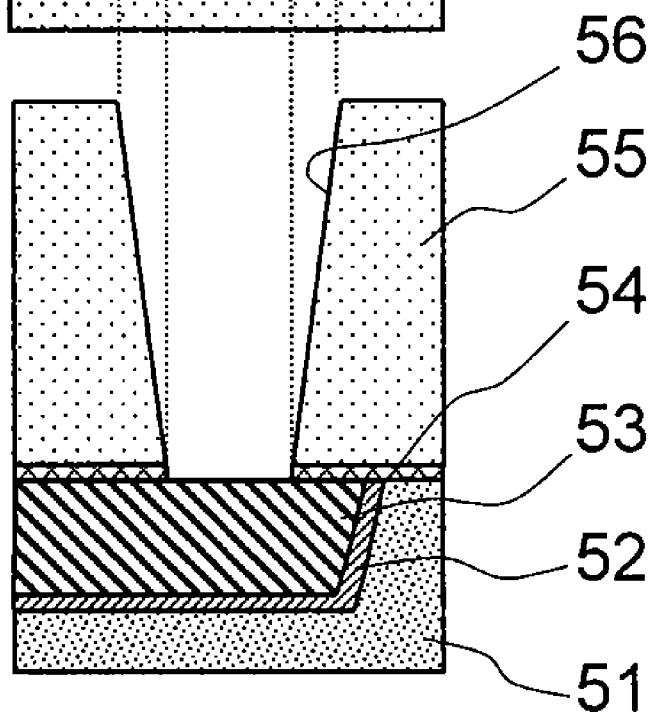
Figure 10:
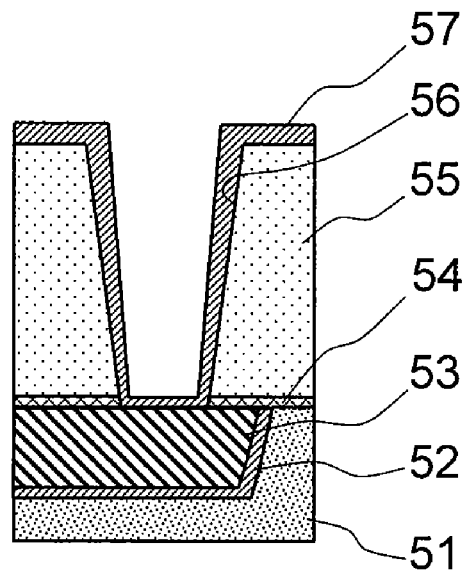
FIG. 10 is an explanatory diagram of conventional via-hole formation.
Figure 11:
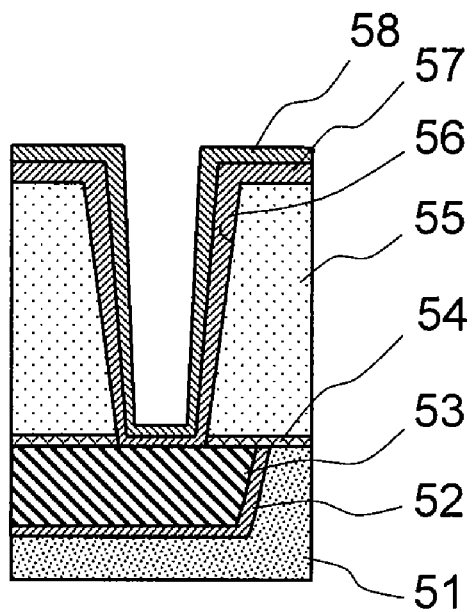
FIG. 11 is an explanatory diagram of conventional via-hole formation.
Figure 12:
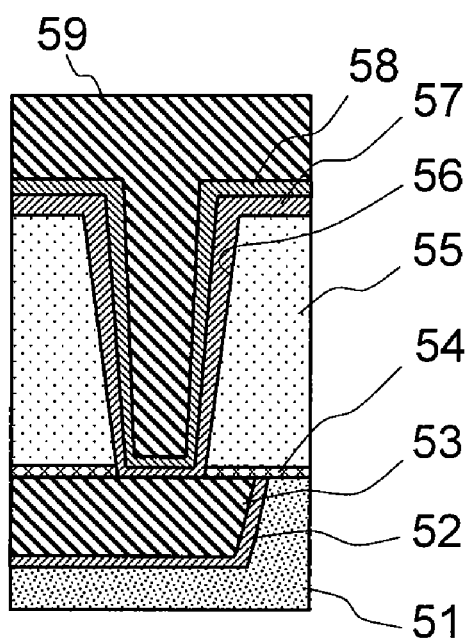
FIG. 12 is an explanatory diagram of conventional via-hole formation.
Figure 13:
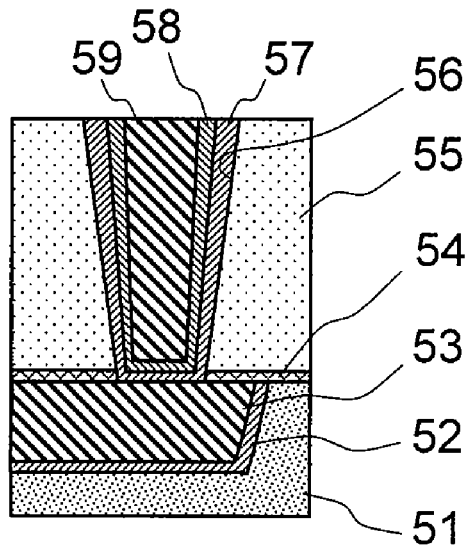
FIG. 13 is an explanatory diagram of conventional via-hole formation.

Further, FIG. 6 shows a production flow to form a sputtered film with a target value of the film thickness on the sidewall of the concave portion, and FIGS. 7, 8A and 8B are drawings for explaining the relationship between the film thickness of a film deposited onto the upper flat portion and the average film thickness of the film deposited onto the internal sidewall of the via-hole and the trench, respectively. Furthermore, FIG. 7A shows an enlarged plan view of the via-hole periphery, and FIG. 7B shows a cross sectional view on the X-X-line in FIG. 7A. Furthermore, FIG. 8A shows an enlarged plan view of the trench periphery, and FIG. 8B shows a cross sectional view on the X-X-line in FIG. 8A.

Furthermore, a semiconductor element has already been formed at a predetermined position on the semiconductor substrate, and a step of covering the element with the insulating film will be described.

Figure 1B:
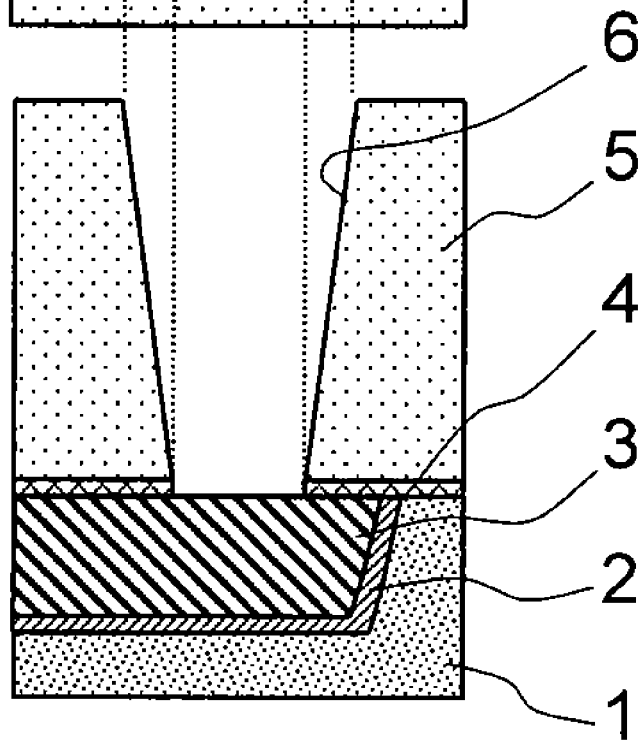

First, as shown in FIGS. 1A and 1B, the insulating film 1, which will be an interlayer insulating film of the lower-level wire, is deposited, and a trench pattern of the lower-level wire is formed in a first interlayer insulating film layer 1 by photolithography or etching. Next, a barrier film 2, such as TaN, and a base wiring material 3 made of Cu or Cu alloy are deposited in respective order, and they are polished by CMP, and when the surface of the first interlayer insulating film 1 is exposed, a lower-level wire where the barrier film 52 and the base wiring material 53 are buried in the trench pattern is formed. Next, a nitride film 4 covering the lower-level wire and a second interlayer insulating film 5 are formed. In FIG. 1A, the shape of the concave portion is circular; however, it may be a trench configuration similar to the wiring pattern.

Figure 2:
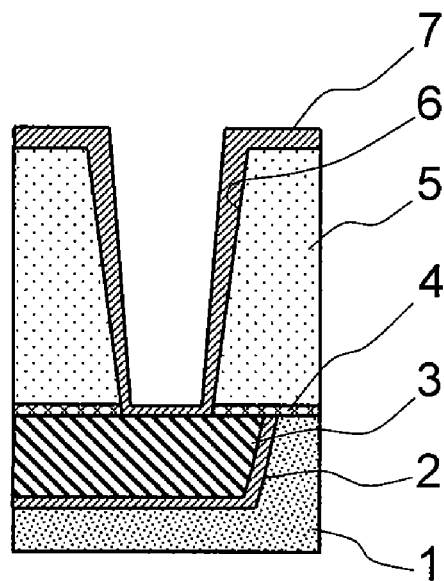
FIG. 2 is a process drawing of a production method for a semiconductor device of the present invention.

Next, as shown in FIG. 2, a barrier film 7 is formed by the sputtering method. Herein, the method for forming a film by sputtering with a target value of the film thickness on the sidewall of the concave portion is described with reference to FIGS. 6, 7A, 7B, 8A, and 8B. A flow to form a sputtered film after the concave portion formation is, as shown in FIG. 6, first, depth of the via-hole (D1 in FIG. 7B) or depth of the trench (D1 of FIG. 8B) is measured, for example, using an inline film thickness measuring instrument. Further, a configuration of the via-hole or the trench is observed by a scanning electron microscope (SEM) from the upper surface of the semiconductor substrate, and the configuration of the via-hole or trench is measured (step S11 of FIG. 6). Here, an opening area S1 of upper end of the via-hole or the trench and an opening area S2 of bottom are acquired.

Next, based upon the configuration measurement result, a projected area of the sidewall of the via-hole viewing from the upper surface (calculated by subtracting the area S2 of the via-hole bottom from the area S1 of the via-hole upper end in FIG. 7B) or the projected area of the trench sidewall viewing from the upper surface (calculated by subtracting the area S2 of the trench bottom from the area S1 of the trench upper end in FIG. 8) is calculated (step S12 of FIG. 6).

In this embodiment, because it is presumed that the pattern of a specific design rule is observed, it is believed that the dimension, i.e., an effect of the area difference (S1-S2) is more dominant than an effect of the variation in an absolute value of S1 or S2. Further, it is believed that the effect of the fluctuation in the absolute values of the dimension in the pattern of the same design rule appears on the difference of the upper areas (S1-S2). Further, in the case of the trench, it is assumed that a constant value, which is the same level or more of the line width, is used for the wire length.

Here, when a sputtered film with film thickness Tt is formed in the flat portion of the concave upper portion, the film thickness Ts to be formed on the sidewall of the concave portion is expressed with a function: Ts=f(Tt, S1-S2, D1) with Tt, the projected area on a sidewall of the concave portion: S1-S2, and D1, and the coefficient can be experimentally calculated. One example of this function is shown in a mathematical expression 1. In this mathematical expression 1, a and b are coefficients, and these coefficients shall be experimentally calculated in advance. Furthermore, although the film thickness Ts may not be uniform depending upon the depth, a mean value shall be adopted in that case. Then, the coefficients of the function in the mathematical expression 1 shall be experimentally calculated in advance. This mathematical formula 1 will be a film thickness prediction formula.

$$Ts = a \times Tt \times ((S1-S2)/D1) + b \quad (1)$$

Next, the film thickness Tt, which is necessary to be formed on the upper flat portion of the concave portion, is calculated from the sidewall area (projected area) S1-S2, the depth D1 and the target value of film thickness Ts, using the mathematical expression 1 (step S13 of FIG. 6).

Next, in order to obtain the predetermined film thickness Ts from the film formation rate R of the sputtering device before forming a sputtered film onto a semiconductor substrate, a treatment time for forming a film with the film thickness Tt onto the upper flat portion is calculated (step S14 of FIG. 6). In general, the relationship between the film formation rate R and the treatment time t is expressed with the following mathematical formula 2:

$$R = Tt/t \quad (2)$$

For the film formation rate R of the sputtering device, an actually-measured value measured by the film thickness meter can be used or it can be calculated from the film thickness and the treatment time of the film formed in the film formation process immediately before.

Alternatively, this may be calculated using a prepared relational expression of a equipment parameter and the film formation rate R from the equipment parameter at the time of wafer treatment treated immediately before. Furthermore, the model expression of the film formation rate R using the equipment parameter can be expressed as with the mathematical expression 3. This mathematical expression 3 will be a film formation rate estimation expression.

$$R = a1 \times P1 + a2 \times P2 + \ldots + an \times Pn + b0 \quad (3)$$

Here, a1 to an and b0 are coefficients, and P1 to Pn are measured data of each equipment parameter. On the occasion of preparing this film formation rate estimation expression, RF power of coil, coil DC voltage, power of the substrate bias and DC bias potential of the substrate are incorporated other than integral power of target, target voltage, target electric current and chamber voltage used in the prior art, as the equipment parameter according to a device configuration of the sputtering device. With this design, a film formation rate can be extremely accurately estimated compared to the conventional estimation expression.

Next, a sputtering treatment is conducted to the semiconductor substrate for the treatment time t (step S15 of FIG. 6). As a result, as shown in FIG. 2, the barrier film 7 is formed not only on the substrate surface but also within the via-hole 6.

Furthermore, as the barrier film, for example, a Ta film, a TaN film, a Ti film, a TiSiN film, a TiN film and a WN film or each laminated film can be formed.

Figure 3:
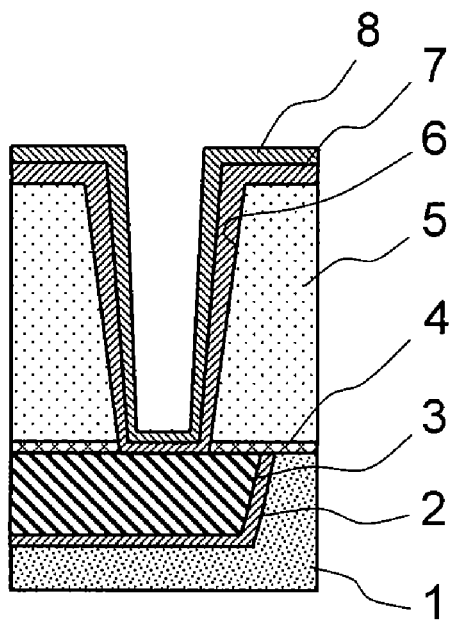
FIG. 3 is a process drawing of a production method for a semiconductor device of the present invention.

Next, as shown in FIG. 3, a seed film 8 is formed by the sputtering method. As the seed film 8, taking the adhesion and contact resistance with a plating film into consideration, a Cu film and a Cu alloy film can be used as similar to the wiring layer. In the formation of this seed film 8, as similar to the formation of the barrier film 7, a sidewall with predetermined film thickness can be formed according to the measurement results of the projected area of the sidewall of the concave portion and the depth of the concave portion at the time of concave portion formation.

Next, plating is conducted and a plating film (Cu film) 9 is formed over the entire surface of the substrate including the inside of the concave portion.

Figure 4:
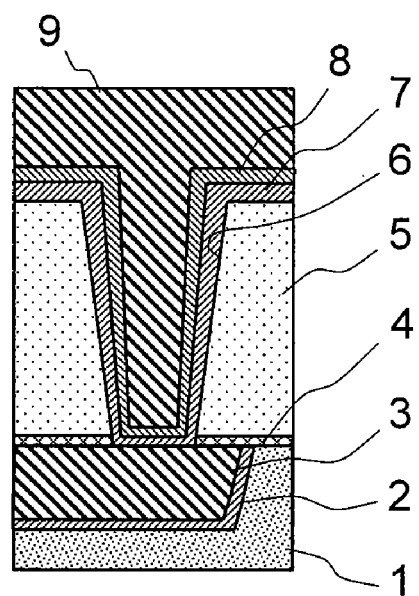
FIG. 4 is a process drawing of a production method for a semiconductor device of the present invention.
Figure 5:
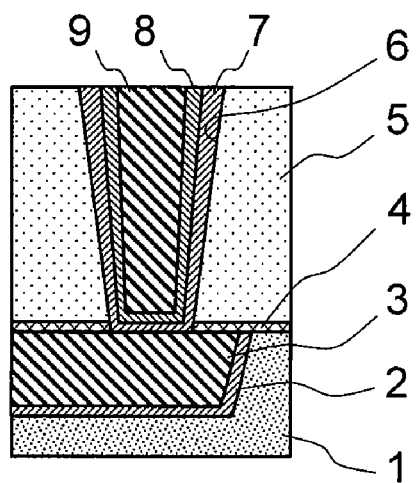
FIG. 5 is a process drawing of a production method for a semiconductor device of the present invention.

Next, as shown in FIG. 4, for example, the plating film 9, the seed film 8 and the barrier film 7 on the second interlayer insulating film 5 outside the via-hole 6 are removed, for example, by CMP (chemical mechanical polishing), and the surface of the Cu film 9 and the surface of the second interlayer insulating film 5 filled inside the via-hole 6 are made to be coplanar. With this process, as shown in FIG. 5, a burying type wiring layer composed of the barrier film 7, the seed film 8 and the Cu film 9 is formed within the via-hole 6.

As described above, even if the configuration of a concave portion varies, the sidewall with predetermined film thickness can be formed by using the film thickness estimation formula and the film formation rate estimation formula reflecting measurement results of a projected area on a sidewall of the concave portion and depth of the concave portion. Furthermore, for the film thickness estimation expression and the film formation rate estimation expression, only one of them may be used, or both may be used as used in this embodiment.

What is claimed is:

1. A production method for a semiconductor device provided with a conductive film with predetermined film thickness on a sidewall of a concave portion formed in an insulating film, comprising:
   a step of forming a concave portion in the insulating film formed on the semiconductor substrate; and
   a step of forming a conductive film with a film thickness calculated based upon a film thickness of a conductive film to be formed in the concave portion, a depth of the concave portion, and a projected area on the sidewall of said concave portion when viewing the concave portion from the upper surface, to be formed over the upper surface of the insulating film where the concave portion is formed, using a sputtering method where substrate RF power is applied, wherein
   a film thickness of the conductive film to be formed at a bottom surface of the concave portion is thinner than that of the conductive film to be formed over the upper surface of the insulating film where the concave portion is formed.

2. The production method for a semiconductor device according to claim 1, wherein
   the step forming the conductive film comprises:
   a step of measuring the depth of the concave portion;
   a step of measuring an opening area of an upper end of the concave portion and an opening area of a bottom of the concave portion;
   a step of calculating the projected area on the sidewall of the concave portion according a difference between the opening area of the upper end of the concave portion and the opening area of the bottom of the concave portion;
   a step of calculating the film thickness to be formed over the upper surface of the insulating film where the concave portion is formed according to a film thickness estimation expression expressed with the measured depth of the concave portion, the calculated projected area and the film thickness of the conductive film to be formed over the sidewall of the concave portion; and
   a step of forming the conductive film on the insulating film where the concave portion is formed with the calculated film thickness to be formed over the upper surface of the insulating film, using the sputtering method.

3. The production method for a semiconductor device according to claim 1, wherein
   a treatment time for obtaining the calculated film thickness to be formed over the upper surface of the insulating film where the concave portion is formed is calculated from the calculated film thickness to be formed over the upper surface of the insulating film where the concave portion is formed and a film formation rate estimation expression expressed with equipment parameters of equipment where sputtered film formation is implemented, and the conductive film is formed by forming a conductive film for the calculated treatment time.

4. The production method for a semiconductor device according to claim 2, wherein
   a treatment time for obtaining the calculated film thickness to be formed over the upper surface of the insulating film where the concave portion is formed is calculated from the calculated film thickness to be formed over the upper surface of the insulating film where the concave portion is formed and a film formation rate estimation expression expressed with equipment parameters of facilities where sputtered film formation is implemented, and the conductive film is formed by forming the conductive film at the calculated treatment time.

* * * * *